United States Patent
Hwang et al.

(10) Patent No.: US 11,362,161 B2
(45) Date of Patent: Jun. 14, 2022

(54) DISPLAY DEVICE

(71) Applicant: Samsung Display Co., Ltd., Yongin-si (KR)

(72) Inventors: Young In Hwang, Yongin-si (KR); Ji Hye Kong, Yongin-si (KR); Suk Hoon Ku, Yongin-si (KR); Sung Wook Kim, Yongin-si (KR); Jin A Lee, Yongin-si (KR); Yun Sik Joo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 79 days.

(21) Appl. No.: 16/823,119

(22) Filed: Mar. 18, 2020

(65) Prior Publication Data
US 2020/0395424 A1    Dec. 17, 2020

(30) Foreign Application Priority Data
Jun. 12, 2019    (KR) ................. 10-2019-0069610

(51) Int. Cl.
| | | |
|---|---|---|
| H01L 27/32 | (2006.01) | |
| G09G 3/3233 | (2016.01) | |
| H01L 29/786 | (2006.01) | |
| G09G 3/20 | (2006.01) | |
| G09G 3/3266 | (2016.01) | |

(Continued)

(52) U.S. Cl.
CPC ....... *H01L 27/3262* (2013.01); *G09G 3/3233* (2013.01); *G09G 3/2007* (2013.01); *G09G 3/3266* (2013.01); *G09G 3/3275* (2013.01); *G09G 2300/0426* (2013.01); *G09G 2300/0809* (2013.01); *G09G 2310/08* (2013.01); *G09G 2320/0233* (2013.01);

(Continued)

(58) Field of Classification Search
CPC .......... H01L 27/3262; H01L 29/78696; H01L 27/1251; G09G 2300/0809
See application file for complete search history.

(56) References Cited

U.S. PATENT DOCUMENTS

| | | |
|---|---|---|
| 9,343,484 B2 | 5/2016 | Park et al. |
| 10,319,306 B2 | 6/2019 | Jeong et al. |
| 2020/0027939 A1* | 1/2020 | Cho ............... G09G 3/3275 |

FOREIGN PATENT DOCUMENTS

| | | |
|---|---|---|
| KR | 10-0570696 B1 | 4/2006 |
| KR | 10-2016-0027332 A | 3/2016 |
| KR | 10-2017-0143049 A | 12/2017 |

* cited by examiner

*Primary Examiner* — Anthony Ho
(74) *Attorney, Agent, or Firm* — Lewis Roca Rothgerber Christie LLP

(57) ABSTRACT

A display device includes pixels. Each of the pixels includes: a first transistor including a gate electrode connected to a first node, a first electrode connected to a second node, and a second electrode connected to a third node; a second transistor including a gate electrode connected to a first scan line, a first electrode connected to a data line, and a second electrode connected to the second node; a first sub-transistor including a gate electrode connected to the first scan line, a first electrode connected to the first node, and a second electrode connected to a fourth node; and a second sub-transistor including a gate electrode connected to the first scan line, a first electrode connected to the fourth node, and a second electrode connected to the third node. A channel width of the second sub-transistor is wider than a channel width of the first sub-transistor.

16 Claims, 16 Drawing Sheets

(51) Int. Cl.
*G09G 3/3275* (2016.01)
*H01L 27/12* (2006.01)
(52) U.S. Cl.
CPC .. *G09G 2320/0247* (2013.01); *H01L 27/1251* (2013.01); *H01L 29/78696* (2013.01)

DISPLAY DEVICE

CROSS-REFERENCE TO RELATED APPLICATION

This application claims priority to and the benefit of Korean patent application 10-2019-0069610 filed on Jun. 12, 2019 in the Korean Intellectual Property Office, the entire disclosure of which is incorporated herein by reference.

BACKGROUND

1. Field

The present disclosure generally relates to a display device.

2. Related Art

With the development of information technologies, the importance of a display device which is a connection medium between a user and information increases. Accordingly, display devices such as a liquid crystal display device, and an organic light emitting display device are increasingly used.

A display device may be driven according to various driving frequencies. For example, when the display device is driven at a driving frequency of 60 Hz, the display device may display 60 image frames per second. For example, when the display device is driven at a driving frequency of 15 Hz, the display device may display 15 image frames per second.

When the display device is driven at a low frequency (e.g., 15 Hz), each pixel should maintain a data voltage for each image frame for a relatively long period of time, as compared with when the display device is driven at a normal frequency (e.g., 60 Hz). When a leakage current is generated in a direction in which luminance decreases, flicker may occur due to the difference between an initial luminance IL and an ending luminance EL of the image frame (see FIG. 17).

SUMMARY

Embodiments provide a display device capable of decreasing a leakage current in a direction in which luminance decreases, and increasing a leakage current in a direction in which luminance increases.

In accordance with an aspect of the present disclosure, there is provided a display device including pixels, wherein each of the pixels includes: a first transistor including a gate electrode connected to a first node, a first electrode connected to a second node, and a second electrode connected to a third node; a second transistor including a gate electrode connected to a first scan line, a first electrode connected to a data line, and a second electrode connected to the second node; a first sub-transistor including a gate electrode connected to the first scan line, a first electrode connected to the first node, and a second electrode connected to a fourth node; and a second sub-transistor including a gate electrode connected to the first scan line, a first electrode connected to the fourth node, and a second electrode connected to the third node, wherein a channel width of the second sub-transistor is wider than a channel width of the first sub-transistor.

The channel width of the first sub-transistor may be narrower than a first electrode region width or a second electrode region width of the first sub-transistor.

A channel of the first sub-transistor may include a concave portion.

The channel width of the second sub-transistor may be wider than a first electrode region width or a second electrode region width of the second sub-transistor.

A channel of the second sub-transistor may include a convex portion.

A channel length of the second sub-transistor may be equal to or shorter than that of the first sub-transistor.

Each of the pixels may further include: a third sub-transistor including a gate electrode connected to a second scan line, a first electrode connected to the first node, and a second electrode connected to a fifth node; and a fourth sub-transistor including a gate electrode connected to the second scan line, a first electrode connected to the fifth node, and a second electrode connected to an initialization line. A channel width of a third sub-transistor may be wider than the channel width of the first sub-transistor.

The channel width of the third sub-transistor may be wider than a first electrode region width or a second electrode region width of the third sub-transistor.

A channel of the third sub-transistor may include a convex portion.

Each of the pixels may further include: a third sub-transistor including a gate electrode connected to a second scan line, a first electrode connected to the first node, and a second electrode connected to a fifth node; and a fourth sub-transistor including a gate electrode connected to the second scan line, a first electrode connected to the fifth node, and a second electrode connected to an initialization line. A channel width of the fourth sub-transistor may be wider than the channel width of the first sub-transistor.

The channel width of the fourth sub-transistor may be wider than a first electrode region width or a second electrode region width of the fourth sub-transistor.

A channel of the fourth sub-transistor may include a convex portion.

Each of the pixels may further include a fourth transistor including a gate electrode connected to a second scan line, a first electrode connected to the first node, and a second electrode connected to an initialization line. A channel width of the fourth transistor may be wider than the channel width of the first sub-transistor.

In accordance with another aspect of the present disclosure, there is provided a display device including pixels, wherein each of the pixels includes: a first transistor including a gate electrode connected to a first node, a first electrode connected to a second node, and a second electrode connected to a third node; a second transistor including a gate electrode connected to a first scan line, a first electrode connected to a data line, and a second electrode connected to the second node; a first sub-transistor including a gate electrode connected to the first scan line, a first electrode connected to the first node, and a second electrode connected to a fourth node; and a second sub-transistor including a gate electrode connected to the first scan line, a first electrode connected to the fourth node, and a second electrode connected to the third node, wherein a channel width of the first sub-transistor is wider than a channel width of the second sub-transistor.

The channel width of the first sub-transistor may be wider than a first electrode region width or a second electrode region width of the first sub-transistor.

A channel of the first sub-transistor may include a convex portion.

In accordance with still another aspect of the present disclosure, there is provided a display device including pixels, wherein each of the pixels includes: a first transistor including a gate electrode connected to a first node, a first electrode connected to a second node, and a second electrode connected to a third node; a second transistor including a gate electrode connected to a first scan line, a first electrode connected to a data line, and a second electrode connected to the second node; a third transistor including a gate electrode connected to the first scan line, a first electrode connected to the first node, and a second electrode connected to the third node; a first sub-transistor including a gate electrode connected to a second scan line, a first electrode connected to the first node, and a second electrode connected to a fifth node; and a second sub-transistor including a gate electrode connected to the second scan line, a first electrode connected to the fifth node, and a second electrode connected to an initialization line, wherein a channel width of the first sub-transistor is wider than a channel width of the second sub-transistor.

A channel of the first sub-transistor may include a convex portion.

In accordance with still another aspect of the present disclosure, there is provided a display device including pixels, wherein each of the pixels includes: a first transistor including a gate electrode connected to a first node, a first electrode connected to a second node, and a second electrode connected to a third node; a second transistor including a gate electrode connected to a first scan line, a first electrode connected to a data line, and a second electrode connected to the second node; a third transistor including a gate electrode connected to the first scan line, a first electrode connected to the first node, and a second electrode connected to the third node; a first sub-transistor including a gate electrode connected to a second scan line, a first electrode connected to the first node, and a second electrode connected to a fifth node; and a second sub-transistor including a gate electrode connected to the second scan line, a first electrode connected to the fifth node, and a second electrode connected to an initialization line, wherein a channel width of the second sub-transistor is wider than a channel width of the first sub-transistor.

A channel of the second sub-transistor may include a convex portion.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
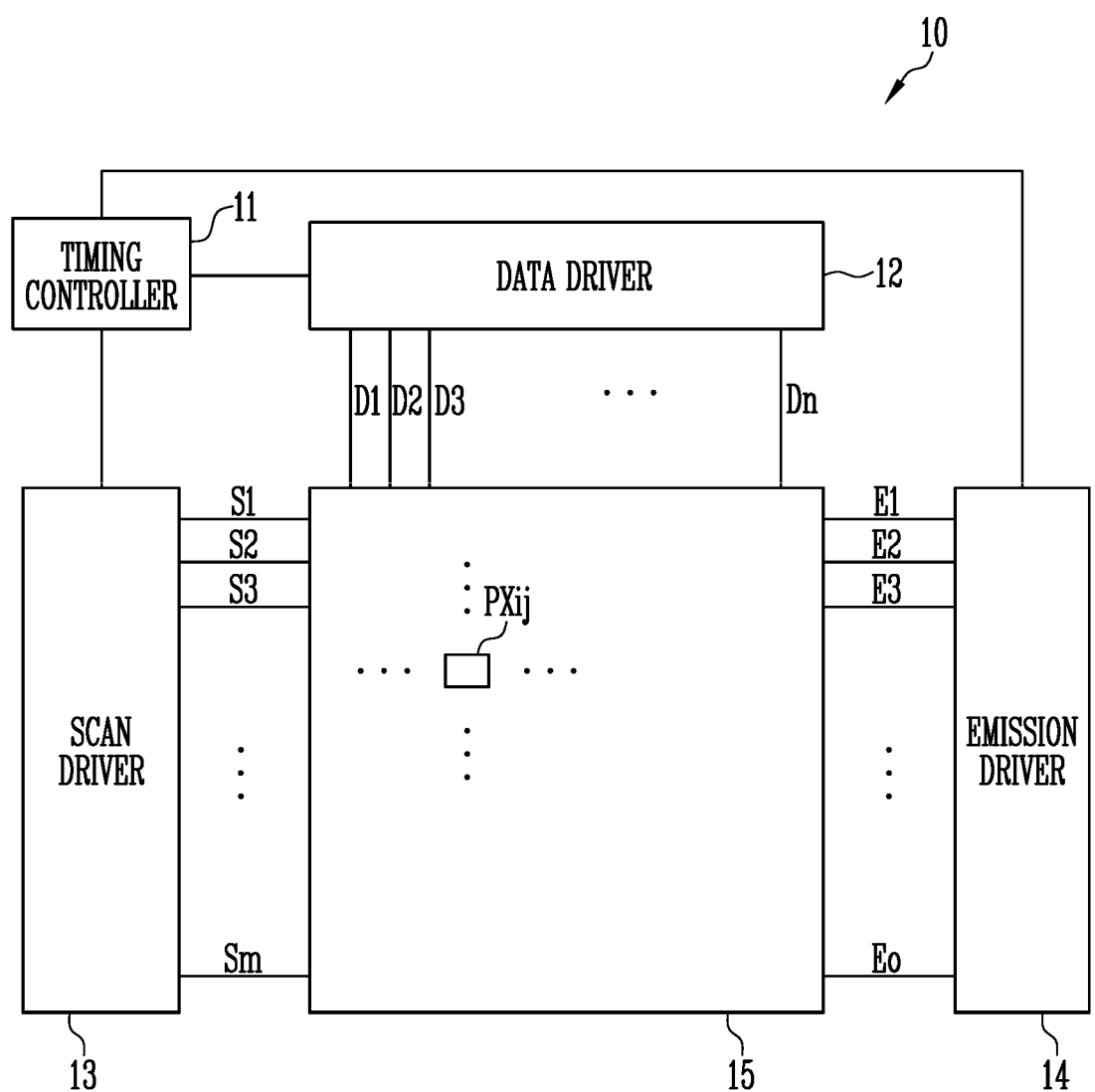
FIG. 1 is a diagram illustrating a display device in accordance with an embodiment of the present disclosure.

Hereinafter, exemplary embodiments are described in detail with reference to the accompanying drawings so that those skilled in the art may easily practice the present disclosure. The present disclosure may be implemented in various different forms and is not limited to the exemplary embodiments described in the present specification.

A part irrelevant to the description may be omitted to clearly describe the present disclosure, and the same or similar constituent elements will be designated by the same reference numerals throughout the specification. Therefore, the same reference numerals may be used in different drawings to identify the same or similar elements.

In addition, the size and thickness of each component illustrated in the drawings are arbitrarily shown for better understanding and ease of description, but the present disclosure is not limited thereto. Thicknesses of several portions and regions are exaggerated for clear expressions.

FIG. 1 is a diagram illustrating a display device in accordance with an embodiment of the present disclosure.

Referring to FIG. 1, the display device 10 in accordance with the embodiment of the present disclosure may include a timing controller 11, a data driver 12, a scan driver 13, an emission driver 14, and a pixel unit 15.

The timing controller 11 may receive grayscale values and control signals with respect to respective image frames from an external processor. The timing controller 11 may render the grayscale values to correspond to specifications of the display device 10. For example, the external processor may provide a red grayscale value, a green grayscale value, and a blue grayscale value with respect to respective unit dots. However, for example, when the pixel unit 15 has a Pentile® structure (Pentile® is a registered trademark of Samsung Display Co., Ltd., Republic of Korea), adjacent unit dots share a pixel, and therefore, pixels may not correspond one-to-one to the respective grayscale values. Accordingly, it may be necessary to render the grayscale values. When the pixels correspond one-to-one to the respective grayscale values, it may be unnecessary to render the grayscale values. Grayscale values that are rendered or are not rendered may be provided to the data driver 12. Also, the timing controller 11 may provide the data driver 12, the scan driver 13, the emission driver 14 and any other suitable components with control signals suitable for their specifications so as to achieve frame display.

The data driver 12 may generate data voltages to be provided to data lines D1, D2, D3, ..., and Dn by using grayscale values and control signals. For example, the data driver 12 may sample the grayscale values by using a clock signal, and apply, in units of pixel rows, data voltages corresponding to the grayscale values to the data lines D1, D2, D3, ..., and Dn (where n is an integer greater than 0).

The scan driver 13 may generate scan signals to be provided to scan lines S1, S2, S3, ..., and Sm by receiving a clock signal, a scan start signal, and the like from the timing controller 11 (where m is an integer greater than 0.

The scan driver 13 may supply (e.g., sequentially supply) scan signals having pulses of a turn-on level to the scan lines S1, S2, S3, ..., and Sm. The scan driver 13 may include scan stages configured in a shift register form. The scan driver 13 may generate scan signals in a manner that sequentially transfers the scan start signal in the form of a pulse of the turn-on level to a next scan stage under the control of the clock signal.

The emission driver 14 may generate emission signals to be provided to emission lines E1, E2, E3, ..., and Eo by receiving a clock signal, an emission stop start signal, and the like from the timing controller 11. For example, the emission driver 14 may supply (e.g., sequentially supply) emission signals having pulses of a turn-off level to the emission lines E1, E2, E3, ..., and Eo (where o is an integer greater than 0). For example, each emission stage of the emission driver 14 may be configured in a shift register form. The emission driver 14 may generate emission signals in a manner that sequentially transfers the emission stop start signal in the form of a pulse of the turn-off level to a next scan stage under the control of the clock signal.

The pixel unit 15 includes pixels. Each pixel PXij (where i and j are natural numbers) may be connected to a corresponding data line, a corresponding scan line, and a corresponding emission line. The pixel PXij may mean a pixel in which a scan transistor is connected to an ith scan line and a jth data line.

Figure 2:
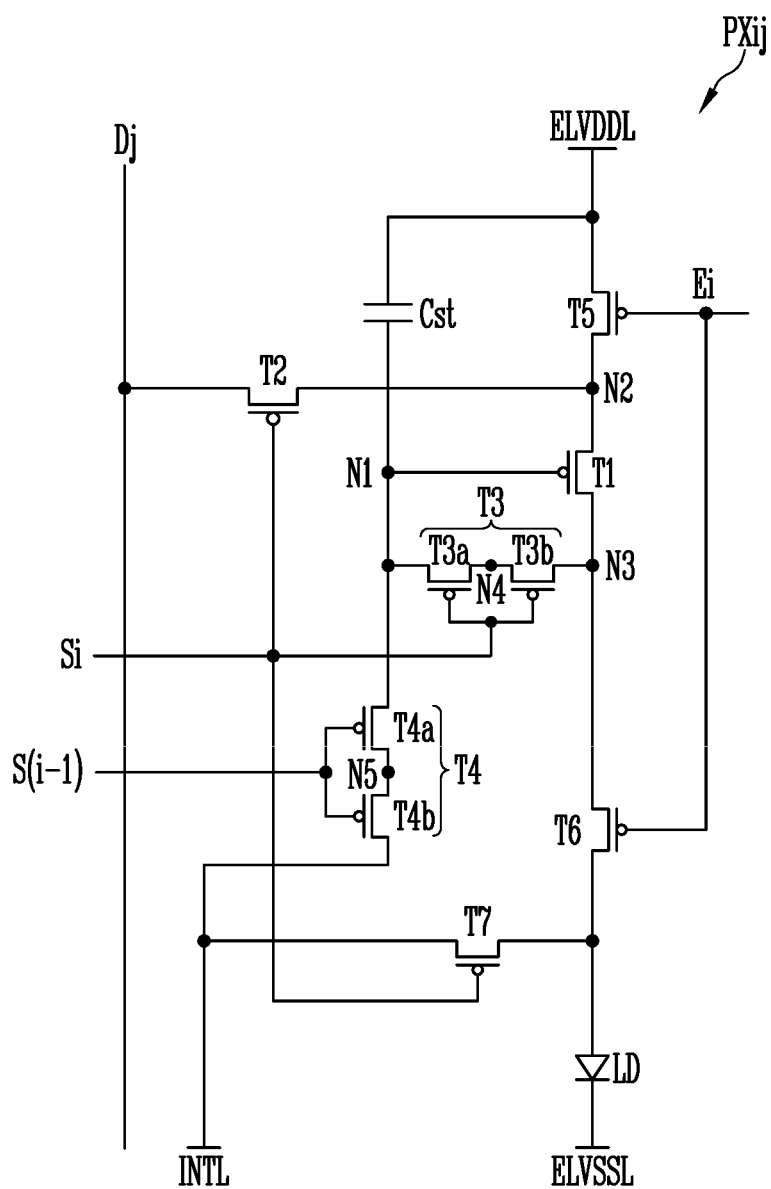
FIG. 2 is a diagram illustrating a pixel in accordance with an embodiment of the present disclosure.

FIG. 2 is a diagram illustrating a pixel in accordance with an embodiment of the present disclosure.

Referring to FIG. 2, the pixel PXij may include transistors T1, T2, T3, T4, T5, T6, and T7, a storage capacitor Cst, and a light emitting diode LD.

Hereinafter, a circuit configured with P-type transistors will be described as an example. However, those skilled in the art may design a circuit configured with N-type transistors by changing the polarity of a voltage applied to a gate terminal. Similarly, those skilled in the art may design a circuit configured with a combination of P-type transistors and N-type transistors. A P-type transistor refers to a transistor in which an amount of current flowing when the difference in voltage between a gate electrode and a source electrode increases in a negative direction increases. An N-type transistor refers to a transistor in which an amount of current flowing when the difference in voltage between a gate electrode and a source electrode increases in a positive direction increases. The transistor may be configured in various forms including a Thin Film Transistor (TFT), a Field Effect Transistor (FET), a Bipolar Junction Transistor (BJT), and/or any other suitable form.

A gate electrode of a first transistor T1 may be connected to a first node N1, a first electrode of the first transistor T1 may be connected to a second node N2, and a second electrode of the first transistor T1 may be connected to a third node N3. The first transistor T1 may be referred to as a driving transistor.

A gate electrode of a second transistor T2 may be connected to an ith scan line Si, a first electrode of the second transistor T2 may be connected to a data line Dj, and a second electrode of the second transistor T2 may be connected to the second node N2. The second transistor T2 may be referred to as a scan transistor.

A gate electrode of a third transistor T3 may be connected to the ith scan line Si, a first electrode of the third transistor T3 may be connected to the first node N1, and a second electrode of the third transistor T3 may be connected to the third node N3. The third transistor T3 may be referred to as a diode-connected transistor.

The third transistor T3 may include a (3-1)th sub-transistor T3a and a (3-2)th sub-transistor T3b. A gate electrode of the (3-1)th sub-transistor T3a may be connected to the ith scan line Si, a first electrode of the (3-1)th sub-transistor T3a may be connected to the first node Ni, and a second electrode of the (3-1)th sub-transistor T3a may be connected to a fourth node N4. A gate electrode of the (3-2)th sub-transistor T3b may be connected to the ith scan line Si, a first electrode of the (3-2)th sub-transistor T3b may be connected to the fourth node N4, and a second electrode of the (3-2)th sub-transistor T3b may be connected to the third node N3.

A gate electrode of a fourth transistor T4 may be connected to an (i−1)th scan line S(i−1), a first electrode of the fourth transistor T4 may be connected to the first node Ni, and a second electrode of the fourth transistor T4 may be connected to an initialization line INTL. In another embodiment, the gate electrode of the fourth transistor T4 may be connected to another scan line. The fourth transistor T4 may be referred to as a gate initialization transistor.

The fourth transistor T4 may include a (4-1)th sub-transistor T4a and a (4-2)th sub-transistor T4b. A gate electrode of the (4-1)th sub-transistor T4a may be connected to the (i−1)th scan line S(i−1), a first electrode of the (4-1)th sub-transistor T4a may be connected to the first node N1, and a second electrode of the (4-1)th sub-transistor T4a may be connected to a fifth node N5. A gate electrode of the (4-2)th sub-transistor T4b may be connected to the (i−1)th scan line S(i−1), a first electrode of the (4-2)th sub-transistor T4b may be connected to the fifth node N5, and a second electrode of the (4-2)th sub-transistor T4b may be connected to the initialization line INTL.

A gate electrode of a fifth transistor T5 may be connected to an ith emission line Ei, a first electrode of the fifth transistor T5 may be connected to a first power line ELVDDL, and a second electrode of the fifth transistor T5 may be connected to the second node N2. The fifth transistor T5 may be referred to as an emission transistor. In another embodiment, the gate electrode of the fifth transistor T5 may be connected to another emission line.

A gate electrode of a sixth transistor T6 may be connected to the ith emission line Ei, a first electrode of the sixth transistor T6 may be connected to the third node N3, and a second electrode of the sixth transistor T6 may be connected to an anode of the light emitting diode LD. The sixth transistor T6 may be referred to as an emission transistor. In another embodiment, the gate electrode of the sixth transistor T6 may be connected to another emission line.

A gate electrode of a seventh transistor T7 may be connected to the ith scan line, a first electrode of the seventh transistor T7 may be connected to the initialization line INTL, and a second electrode of the seventh transistor T7 may be connected to the anode of the light emitting diode LD. The seventh transistor T7 may be referred to as an anode initialization transistor. In another embodiment, the gate electrode of the seventh transistor T7 may be connected to another scan line.

A first electrode of the storage capacitor Cst may be connected to the first power line ELVDDL, and a second electrode of the storage capacitor Cst may be connected to the first node N1.

The anode of the light emitting diode LD may be connected to the second electrode of the sixth transistor T6, and a cathode of the light emitting diode LD may be connected to a second power line ELVSSL. The light emitting diode LE may be implemented with an organic light emitting diode, an inorganic light emitting diode, a quantum dot light emitting diode, or the like.

A first power voltage may be applied to the first power line ELVDDL, a second power voltage may be applied to the second power line ELVSSL, and an initialization voltage may be applied to the initialization line INTL. For example, the first power voltage may be greater than the second power voltage. For example, the initialization voltage may be equal to or greater than the second power voltage.

Figure 3:
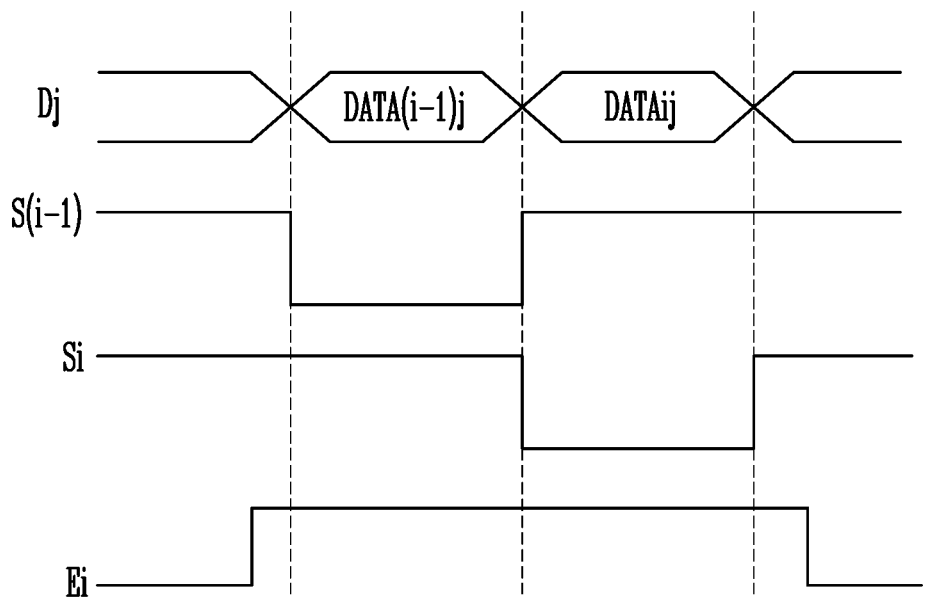
FIG. 3 is a diagram illustrating a driving method of the pixel in accordance with an embodiment of the present disclosure.

FIG. 3 is a diagram illustrating a driving method of the pixel in accordance with an embodiment of the present disclosure.

First, a data voltage DATA(i−1) for an (i−1)th pixel is applied to the data line Dj, and a scan signal having a turn-on level (e.g., a low level) is applied to the (i−1)th scan line S(i−1).

Because a scan signal having a turn-off level (e.g., a high level) is applied to the ith scan line Si, the second transistor T2 is in a turn-off state, and the data voltage DATA(i−1) for the (i−1)th pixel is prevented from being input to the pixel PXij.

Because the fourth transistor T4 is in a turn-on state, the first node N1 is connected (e.g., electrically connected) to the initialization line INTL, so that a voltage of the first node N1 is initialized. Because an emission signal having the turn-off level is applied to the emission line Ei, the transistors T5 and T6 are in the turn-off state, and an unnecessary emission of the light emitting diode LD in the process of applying the initialization voltage is reduced or prevented.

Next, a data voltage DATAij for an ith pixel PXij is applied to the data line Dj, and a scan signal having the turn-on level is applied to the ith scan line Si. Accordingly, the transistors T2, T1, and T3 are in a conducting state (i.e., a turn-on state), and the data line Dj and the first node N1 are electrically connected to each other. Therefore, a compensation voltage obtained by subtracting a threshold voltage of the first transistor T1 from the data voltage Dij is applied the second electrode (i.e., the first node N1) of the storage capacitor Cst, and the storage capacitor Cst maintains a voltage corresponding to the difference between the first power voltage and the compensation voltage. A period in which the storage capacitor Cst maintains the voltage may be referred to as a threshold voltage compensation period.

Because the seventh transistor T7 is in the turn-on state, the anode of the light emitting diode LD and the initialization line INTL are connected to each other, and the light emitting diode LD is initialized with electric charges having a magnitude that corresponds to the difference between the initialization voltage and the second power voltage.

Subsequently, when an emission signal having the turn-on level is applied to the emission line Ei, the transistors T5 and T6 may be in the conducting state (i.e., a turn-on state). Therefore, a driving current path is formed as a path of the first power line ELVDDL, the fifth transistor T5, the first transistor T1, the sixth transistor T6, the light emitting diode LD, and the second power line ELVSSL.

An amount of driving current flowing through the first electrode and the second electrode of the first transistor T1 is controlled according to the voltage maintained in the storage capacitor Cst. The light emitting diode LD emits light with a luminance corresponding to the amount of driving current. The light emitting diode LD emits light until before an emission signal having the turn-off level is applied to the emission line Ei. A period in which the driving current path is maintained may be referred to as an emission period.

In FIG. 3, a case where one pulse having the turn-on level is generated in the scan lines S(i−1) and Si in one image frame period is described as an example. However, in another embodiment, in order to apply an on-bias to the first transistor T1, two or more pulses having the turn-on level may be generated in the scan lines S(i−1) and Si in one image frame period.

Figure 4:
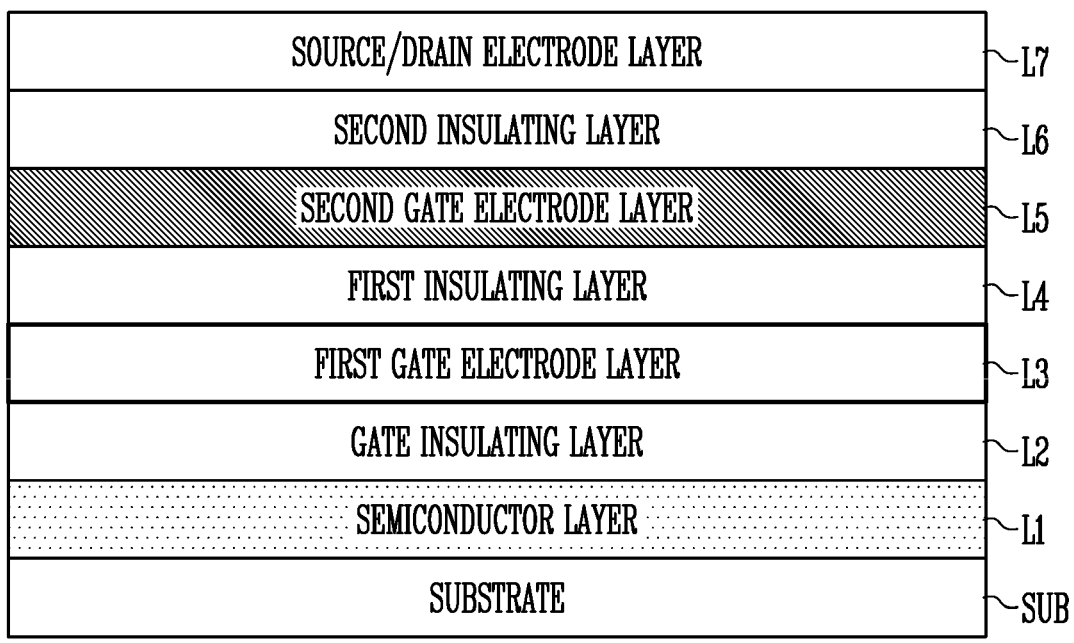
FIG. 4 is a view illustrating a stacked structure of a pixel in accordance with an embodiment of the present disclosure.

FIG. 4 is a view illustrating a stacked structure of a pixel in accordance with an embodiment of the present disclosure.

Referring to FIG. 4, in an embodiment of the present disclosure, each pixel PXij may have a structure in which a semiconductor layer L1, a gate insulating layer L2, a first gate electrode layer L3, a first insulating layer L4, a second gate electrode layer L5, a second insulating layer L6, and a source/drain electrode layer L7 are stacked on a substrate SUB. In some embodiments, the source/drain electrode layer L7 may include a first source/drain electrode layer and a second source/drain electrode layer, which are provided with an insulating layer interposed therebetween.

The transistors T1 to T7, the storage capacitor Cst, and the lines Dj, Si, S(i−1), Ei, ELVDDL, and INTL in the above-described embodiment may be elements formed by patterning at least a portion of the stacked structure.

The substrate SUB may be made of various materials such as glass, polymer, and metal. The substrate SUB may be selected as one of a rigid substrate or a flexible substrate depending on a product to which the substrate SUB is applied. When the substrate SUB includes at least one of a polymer organic material, the substrate SUB may be made of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, or any other suitable substrate. In other embodiments, the substrate SUB may be made of a fiber reinforced plastic (FRP).

A buffer layer or barrier layer may be located between the substrate SUB and the semiconductor layer L1. The buffer layer or barrier layer may be used to prevent an impurity of the substrate SUB from being diffused into the semiconductor layer L1 or to prevent moisture from penetrating into the semiconductor layer L1. The buffer layer or barrier layer may be configured as an organic insulating layer, an inorganic insulating layer, an organic/inorganic insulating layer, or the like. The buffer layer or barrier layer may be configured as a single layer or be configured as multiple layers. For example, the buffer layer or barrier layer may be made of silicon nitride (SiNx), silicon oxide (SiOx), silicon oxynitride (SiOxNy), and/or any other suitable material.

The semiconductor layer L1 may be made of poly silicon, amorphous silicon, an oxide semiconductor, an organic semiconductor, an inorganic semiconductor, and/or any other suitable material. A portion of the semiconductor layer L1 may constitute a channel of each transistor, and another portion of the semiconductor layer L1 may be doped with a P-type impurity (i.e., an acceptor). The portion doped with the acceptor may constitute a first electrode and a second electrode of each transistor and a connection line.

Each of the gate insulating layer L2, the first insulating layer L4, and the second insulating layer L6 prevent unnecessary electrical contact between upper and lower conductive layers. Each of the insulating layers L2, L4, and L6 may be configured as an organic insulating layer, an inorganic insulating layer, an organic/inorganic insulating layer, and/or any other suitable insulating layer. Each of the insulating layers L2, L4, and L6 may be configured as a single layer or be configured as multiple layers. For example, the insulating layers L2, L4, and L6 may be made of silicon nitride (SiNx), silicon oxide (SiOx), silicon oxynitride (SiOxNy), and/or any other suitable material.

Each of the first gate electrode layer L3, the second gate electrode layer L5, and the source/drain electrode layer L7 constitutes a conductive layer. Each conductive layer may be configured as a single layer or be configured as multiple layers. Each conductive layer may be made of gold (Au), silver (Ag), aluminum (Al), molybdenum (Mo), chromium (Cr), titanium (Ti), nickel (Ni), neodymium (Nd), copper (Cu), platinum (Pt), and/or any other suitable material.

A gate electrode of each transistor may be configured with the first gate electrode layer L3. A storage capacitor may be configured using the first gate electrode layer L3 as a lower electrode and using the second gate electrode layer L5 as an upper electrode.

Figure 5:
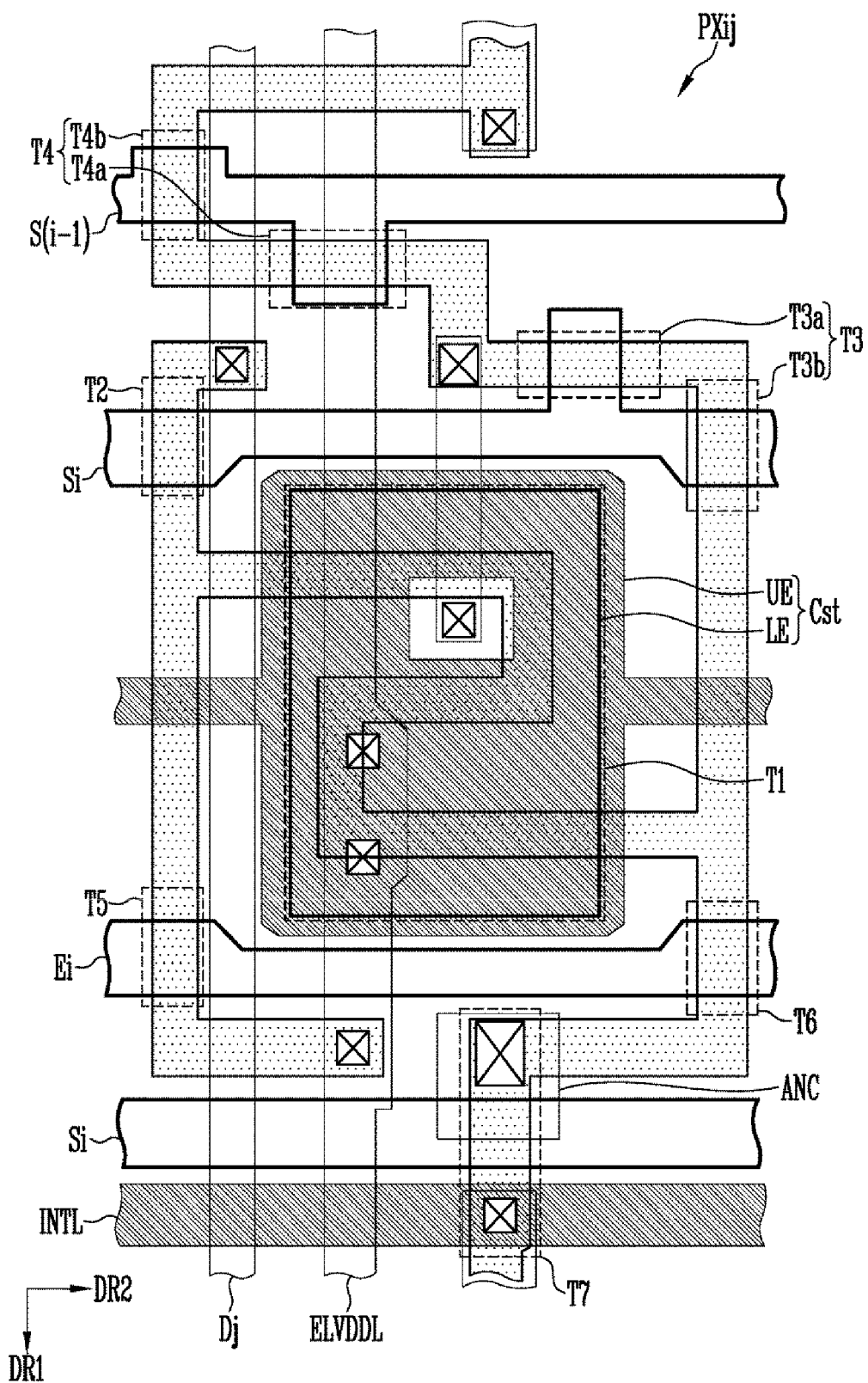
FIG. 5 is a plan view of a pixel in accordance with an embodiment of the present disclosure.

FIG. 5 is a plan view of a pixel in accordance with an embodiment of the present disclosure.

The ith scan line Si, the (i−1)th scan line S(i−1), the emission line Ei, and a lower electrode LE of the storage capacitor Cst may be configured with the first gate electrode layer L3 (e.g., at a same layer as the first gate electrode layer L3).

An upper electrode UE of the storage capacitor Cst and the initialization line INTL may be configured with the second gate electrode layer L5 (e.g., at a same layer as the second gate electrode layer L5).

The data line Dj, the first power line ELVDDL, and some bridge electrodes may be configured with the source/drain electrode layer L7 (e.g., at a same layer as the source/drain electrode layer L7).

A channel of each of the transistors T1 to T7 may be configured with an undoped portion of the semiconductor layer L1 (e.g., at the undoped portion of the of the semiconductor layer L1), and the first electrode and the second electrode of each of the transistors T1 to T7 may be configured with a doped portion of the semiconductor layer L1 (e.g., at the doped portion of the of the semiconductor layer L1). The gate electrode of each of the transistors T1 to T7 may be configured with the first gate electrode layer L3 (e.g., at a same layer as the first gate electrode layer L3).

A connection electrode ANC may connect the second electrode of the seventh transistor T7 and the second electrode of the sixth transistor T6 to the anode of the light emitting diode LD.

Figure 6:
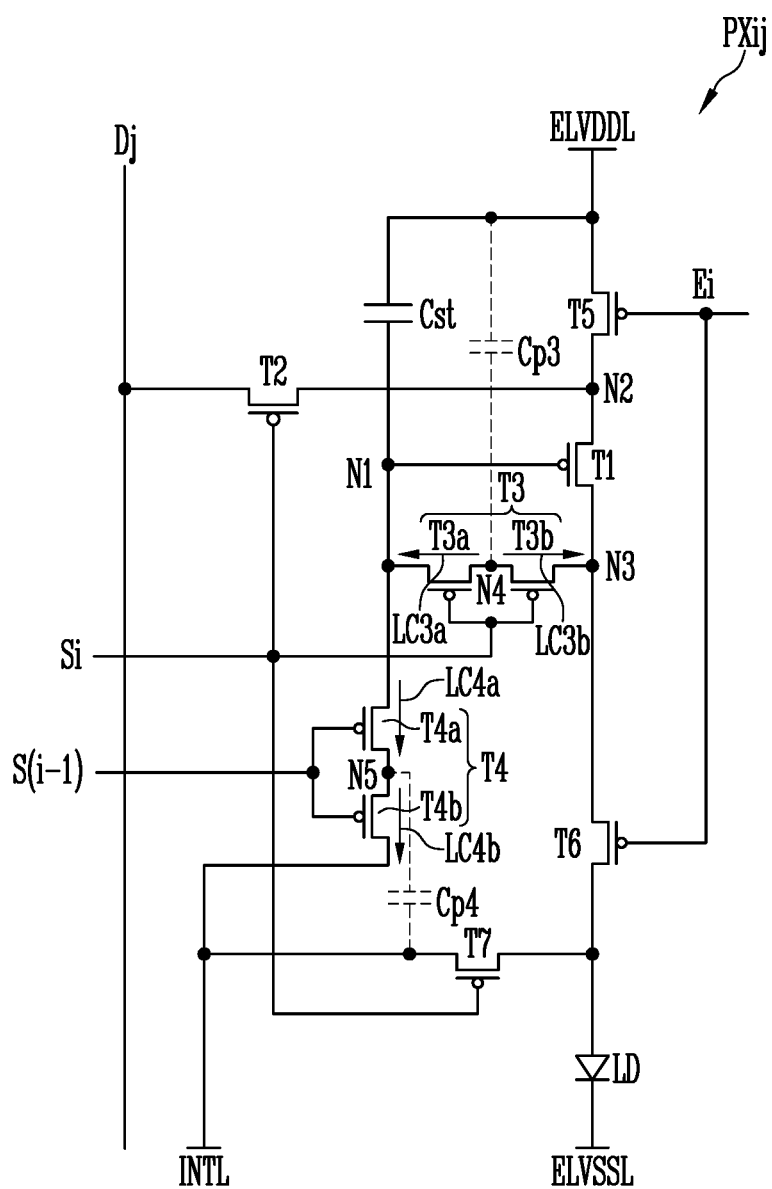
FIG. 6 is a diagram illustrating a leakage current of the pixel shown in FIG. 3.

FIG. 6 is a diagram illustrating a leakage current of the pixel shown in FIG. 3.

When a transistor is in the turn-off state, it is ideal that an off current is 0. However, in practice the off current is not actually 0. Hence, the off current is referred to as a leakage current.

As described above, a compensation voltage may be stored at the first node N1 in the threshold voltage compensation period, and emission luminance may be maintained only when the compensation voltage of the first node N1 is maintained during the emission period.

Figure 16:
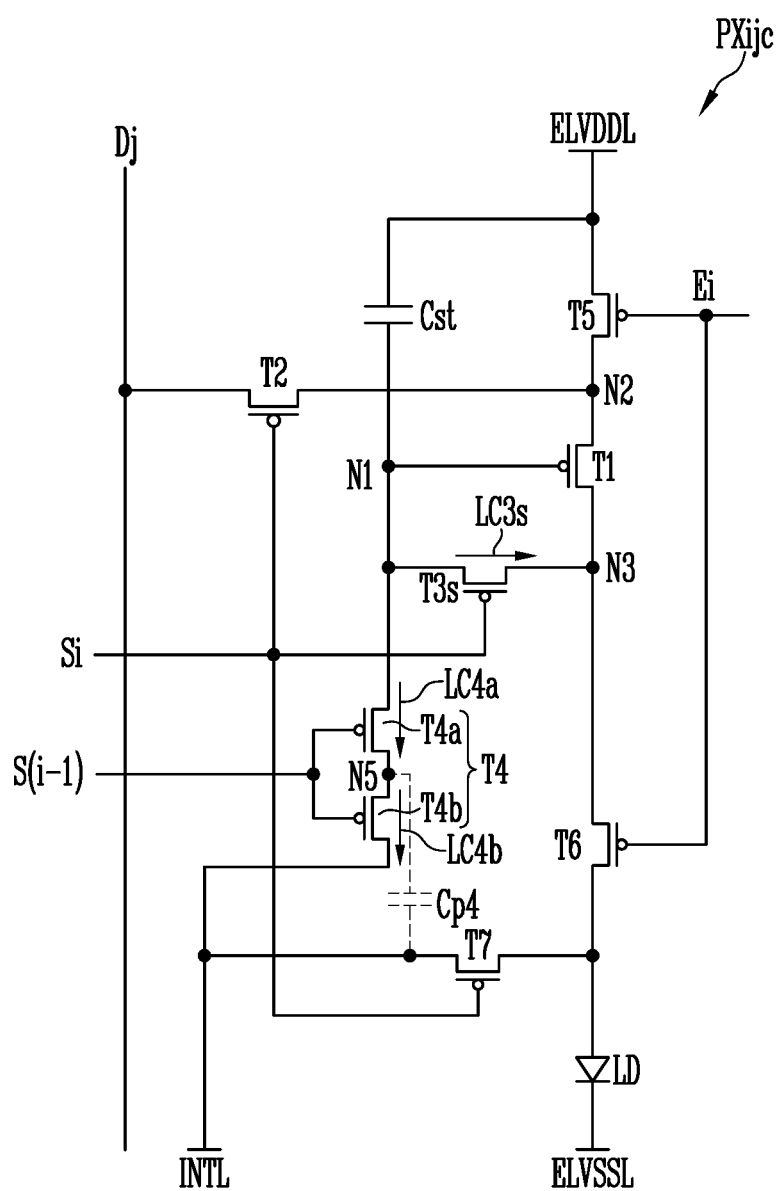
Figure 17:
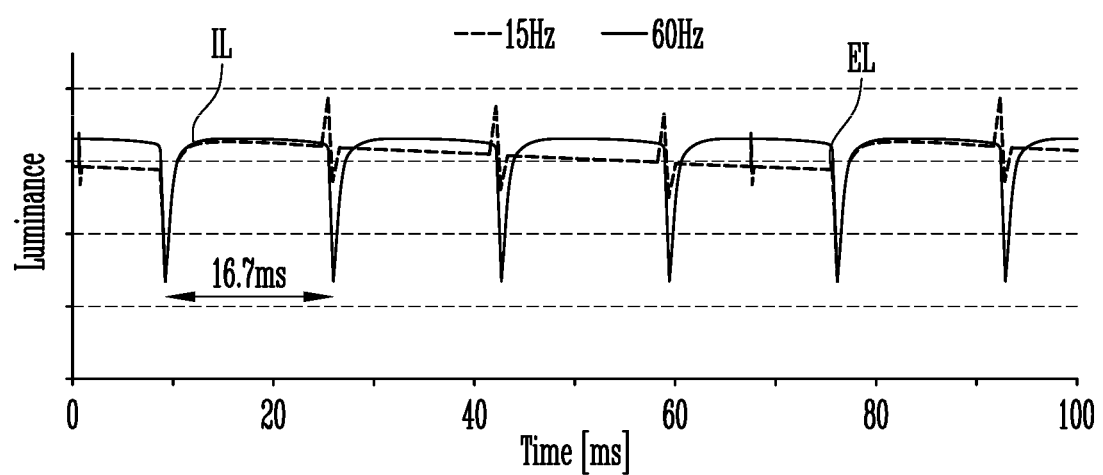
FIG. 17 is a diagram comparing a case where the display device is driven at a low frequency and a case where the display device is driven at a normal frequency.

The leakage current may flow for a longer time as the display device 10 is driven at a lower frequency. Therefore, the compensation voltage of the first node N1 cannot be maintained. Referring to FIG. 17, it can be seen that, when the display device is driven at a low frequency (e.g., 15 Hz), an ending luminance EL of one image frame is lower than an initial luminance IL of the one image frame. Because a first transistor T1 shown in FIG. 16 is a P-type transistor, a voltage of a first node N1 increases as time elapses.

Therefore, in order to increase the end luminance EL, it may be necessary to adjust leakage currents in a direction in which the voltage of the first node N1 decreases.

A parasitic capacitor Cp3 generated between the fourth node N4 and the first power line ELVDDL and a parasitic capacitor Cp4 generated between the fifth node N5 and the initialization line INTL may exist in the pixel PXij.

A leakage current direction of each node may be determined according to the capacitances of the parasitic capacitors Cp3 and Cp4. However, another parasitic capacitor that is not shown in FIG. 6 may become a factor (e.g., a decisive factor) for determining the leakage current direction.

For example, a leakage current LC3a flowing in a direction from the fourth node N4 to the first node N1 may be generated in the (3-1)th sub-transistor T3a. A leakage current LC3b flowing in a direction from the fourth node N4 to the third node N3 may be generated in the (3-2)th sub-transistor T3b. A leakage current LC4a flowing in a direction from the first node N1 to the fifth node N5 may be generated in the (4-1)th sub-transistor T4a. A leakage current LC4b flowing in a direction from the fifth node N5 to the initialization line INTL may be generated in the (4-2)th sub-transistor T4b.

Therefore, in order to increase the end luminance EL, there exist an embodiment in which the leakage current LC3a of the (3-1)th sub-transistor T3a is decreased, an embodiment in which the leakage current LC3b of the (3-2)th sub-transistor T3b is increased, an embodiment in which the leakage current LC4a of the (4-1)th sub-transistor T4a is increased, and an embodiment in which the leakage current LC4b of the (4-2)th sub-transistor T4b is increased. The embodiments may be combined with each other.

Figure 7:
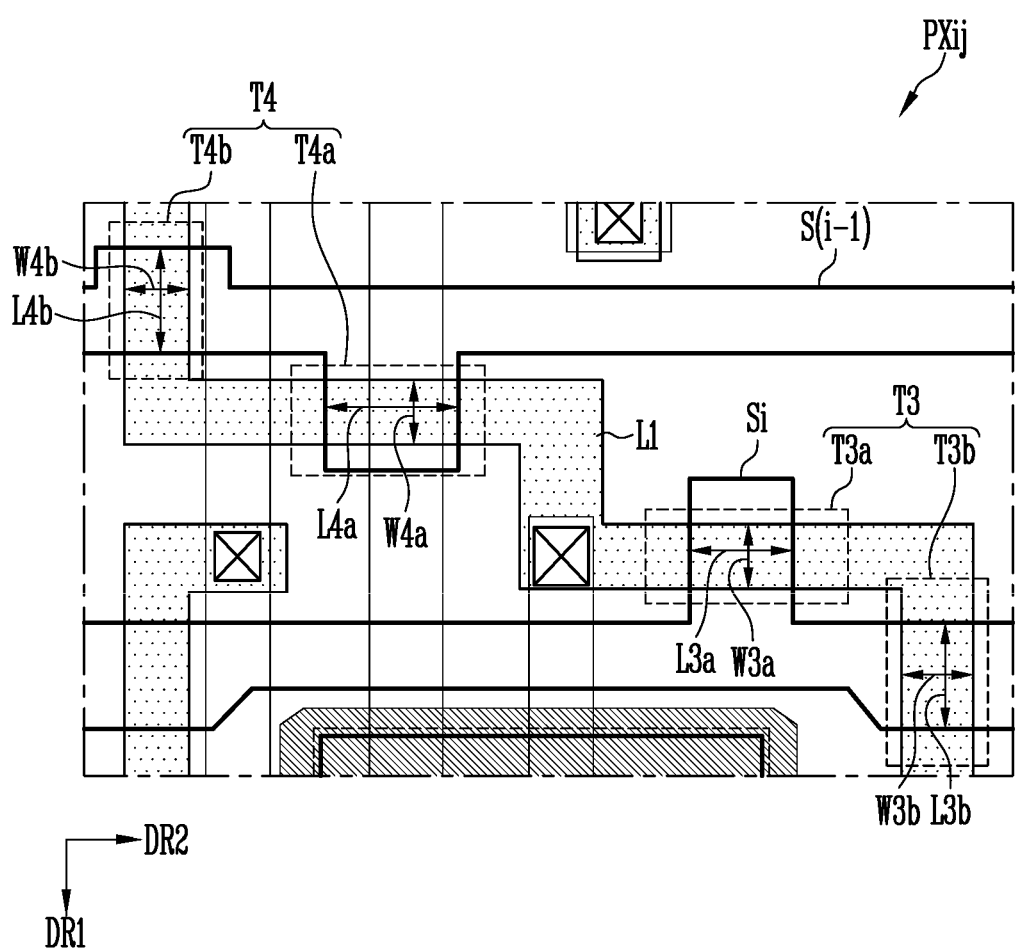
FIG. 7 is a view illustrating channel widths and channel lengths of transistors.

FIG. 7 is a view illustrating channel widths and channel lengths of transistors.

In FIG. 7, for convenience, a channel of each of the transistors is displayed at a portion at which the gate electrode of the transistor and the semiconductor layer L1 overlap with each other. However, as described above, the channel of the transistor may correspond to a doped portion between the first electrode and the second electrode of the transistor, and may not completely overlap with the gate electrode of the transistor.

The (3-1)th sub-transistor T3a may include a channel having a channel width W3a and a channel length L3a. The (3-2)th sub-transistor T3b may include a channel having a channel width W3b and a channel length L3b. The (4-1)th sub-transistor T4a may include a channel having a channel width W4a and a channel length L4a. The (4-2)th sub-transistor T4b may include a channel having a channel width W4b and a channel length L4b.

When the embodiment of the present disclosure is not applied, the channel widths W3a, W3b, W4a, and W4b of the sub-transistors T3a, T3b, T4a, and T4b may be substantially the same. In addition, when the embodiment of the present disclosure is not applied, the channel lengths L3a, L3b, L4a, and L4b of the sub-transistors T3a, T3b, T4a, and T4b may be substantially the same.

When the embodiment of the present disclosure is not applied, the channel width W3a and W3b of the sub-transistors T3a and T3b may be wider than those W4a and W4b of the sub-transistors T4a and T4b. In addition, when the embodiment of the present disclosure is not applied, the channel lengths L3a, L3b, L4a, and L4b of the sub-transistors T3a, T3b, T4a, and T4b may be substantially the same.

Figure 8:
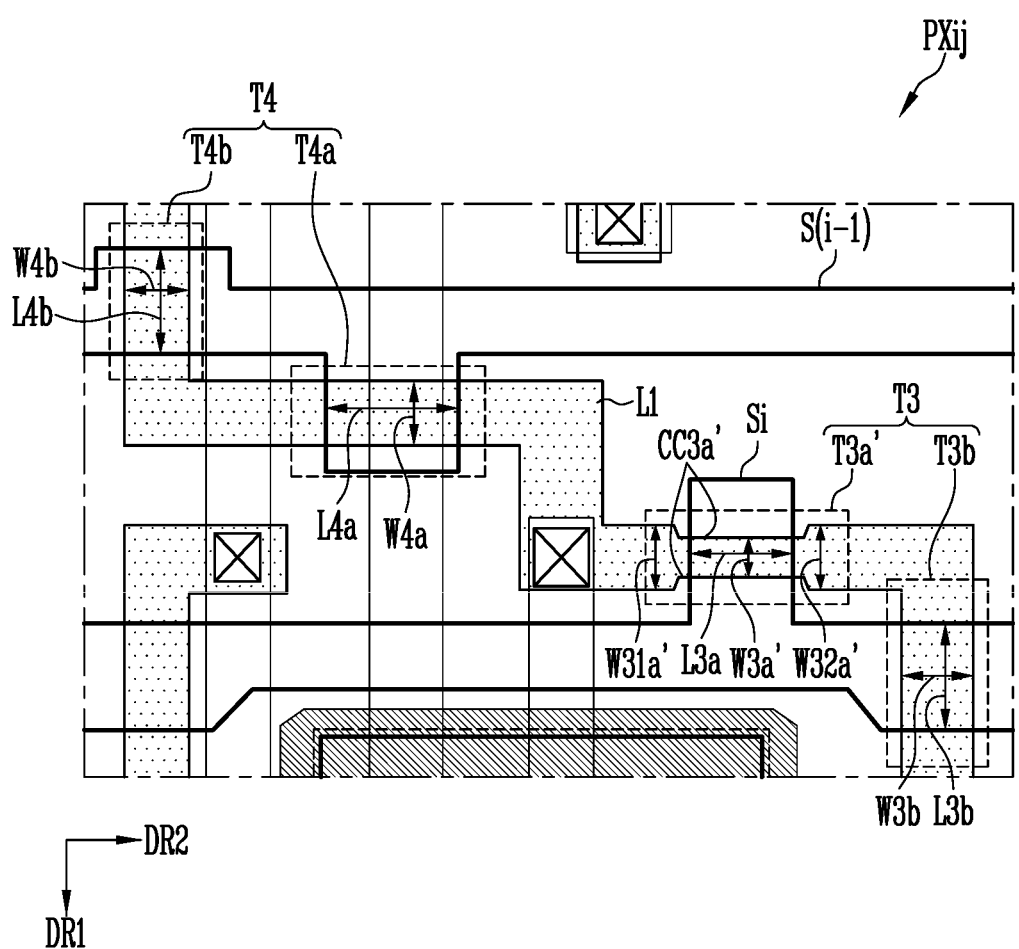
FIG. 8 is a view illustrating a case where a channel of a (3-1)th sub-transistor includes a concave part.

FIG. 8 is a view illustrating a case where a channel of a (3-1)th sub-transistor includes a concave part.

For example, a channel width W3a' of the (3-1)th sub-transistor T3a' may be narrower than a channel width W3b of the (3-2)th sub-transistor T3b. In addition, the channel width W3a' of the (3-1)th sub-transistor T3a' may be narrower than a channel width W4a of the (4-1)th sub-transistor T4a. In addition, the channel width W3a' of the (3-1)th sub-transistor T3a' may be narrower than a channel width W4b of the (4-2)th sub-transistor T4b.

In accordance with an embodiment, the channel width W3a' of the (3-1)th sub-transistor T3a' may be narrower than a first electrode region width W31a' and/or a second electrode region width W32a' of the (3-1)th sub-transistor T3a'. For example, the channel of the (3-1)th sub-transistor T3a' may have a concave portion CC3a'.

In another embodiment, the channel width of the (3-1)th sub-transistor may be equal to the first electrode region width or the second electrode region width of the (3-1)th sub-transistor. For example, the channel of the (3-1)th sub-transistor does not have the concave portion, and the channel width of the (3-1)th sub-transistor may be narrower than the channel width W3b and W4a. However, in this embodiment, the capacitance of the parasitic capacitor Cp3 may be changed due to a decrease in line width of the fourth node N4, and therefore, it may be necessary to reconfirm the leakage current direction of the pixel PXij.

In an embodiment, the channel length L3a of the (3-1)th sub-transistor may be equal to or longer than the channel length L3b of the (3-2)th sub-transistor T3b. In addition, the channel length L3a of the (3-1)th sub-transistor may be equal to or longer than the channel lengths L4a and L4b of the sub-transistors T4a and T4b.

In accordance with the embodiments shown in FIG. 8, the leakage current LC3a of the (3-1)th sub-transistor T3a' can be decreased.

Figure 9:
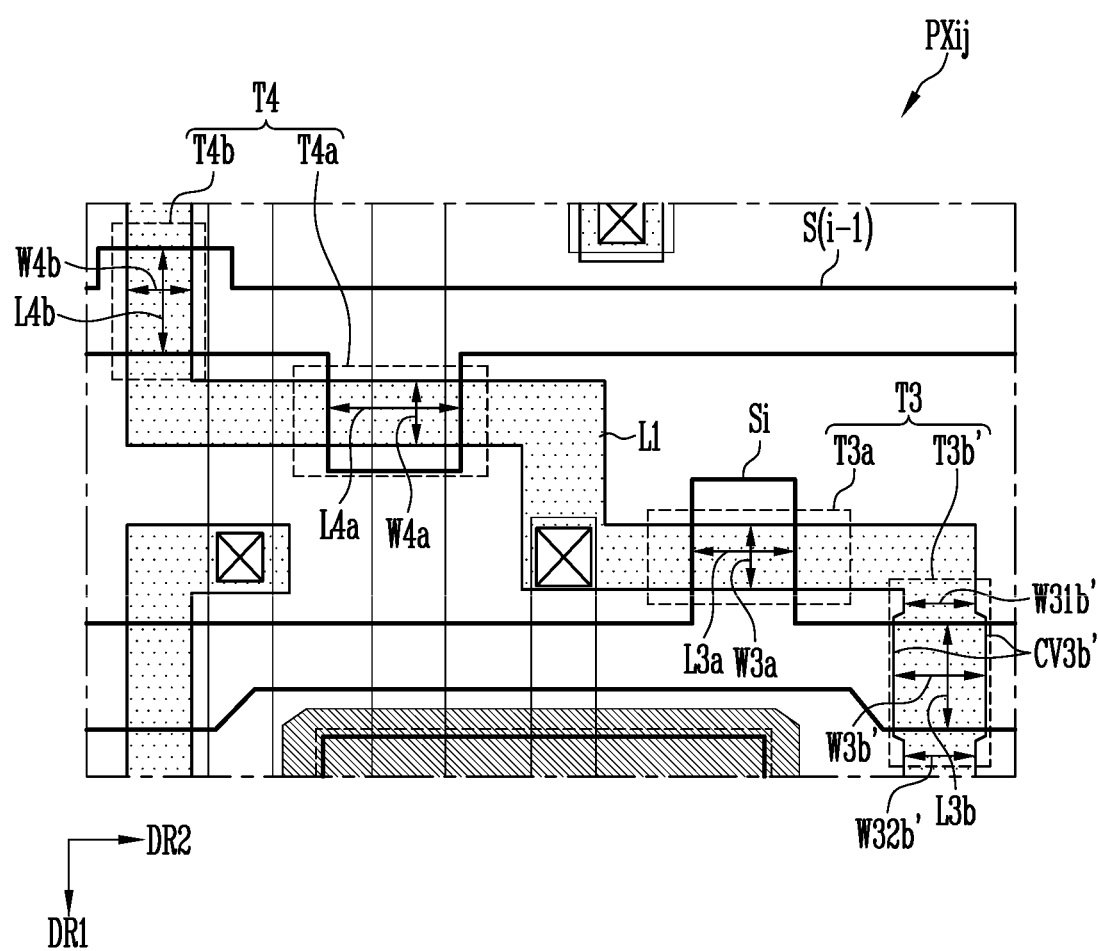
FIG. 9 is a view illustrating a case where a channel of a (3-2)th sub-transistor includes a convex part.

FIG. 9 is a view illustrating a case where a channel of a (3-2)th sub-transistor includes a convex part.

For example, a channel width W3b' of the (3-2)th sub-transistor T3b' may be wider than the channel width W3a of the (3-1)th sub-transistor T3a.

In an embodiment, the channel width W3b' of the (3-2)th sub-transistor T3b' may be wider than a first electrode region width W31b' and/or a second electrode region width W32b' of the (3-2)th sub-transistor T3b'. For example, the channel of the (3-2)th sub-transistor T3b' may have a convex portion CV3b'.

In another embodiment, the channel width W3b' of the (3-2)th sub-transistor T3b' may be equal to the first electrode region width W31b' or the second electrode region width W32b' of the (3-2)th sub-transistor T3b'. For example, the channel of the (3-2)th sub-transistor T3b' does not have the convex portion, and the channel width W3b' of the (3-2)th sub-transistor T3b' may be wider than the channel width W3a of the (3-1)th sub-transistor T3a. However, in this embodiment, the capacitance of the parasitic capacitor Cp3 may be changed due to an increase in line width of the fourth node N4, and therefore, it may be necessary to reconfirm the leakage current direction of the pixel PXij.

In an embodiment, the channel length L3b of the (3-2)th sub-transistor T3b' may be equal to or shorter than the channel length L3a of the (3-1)th sub-transistor T3a.

In accordance with the embodiments shown in FIG. 9, the leakage current LC3b of the (3-2)th sub-transistor T3b' can be increased.

Figure 10:
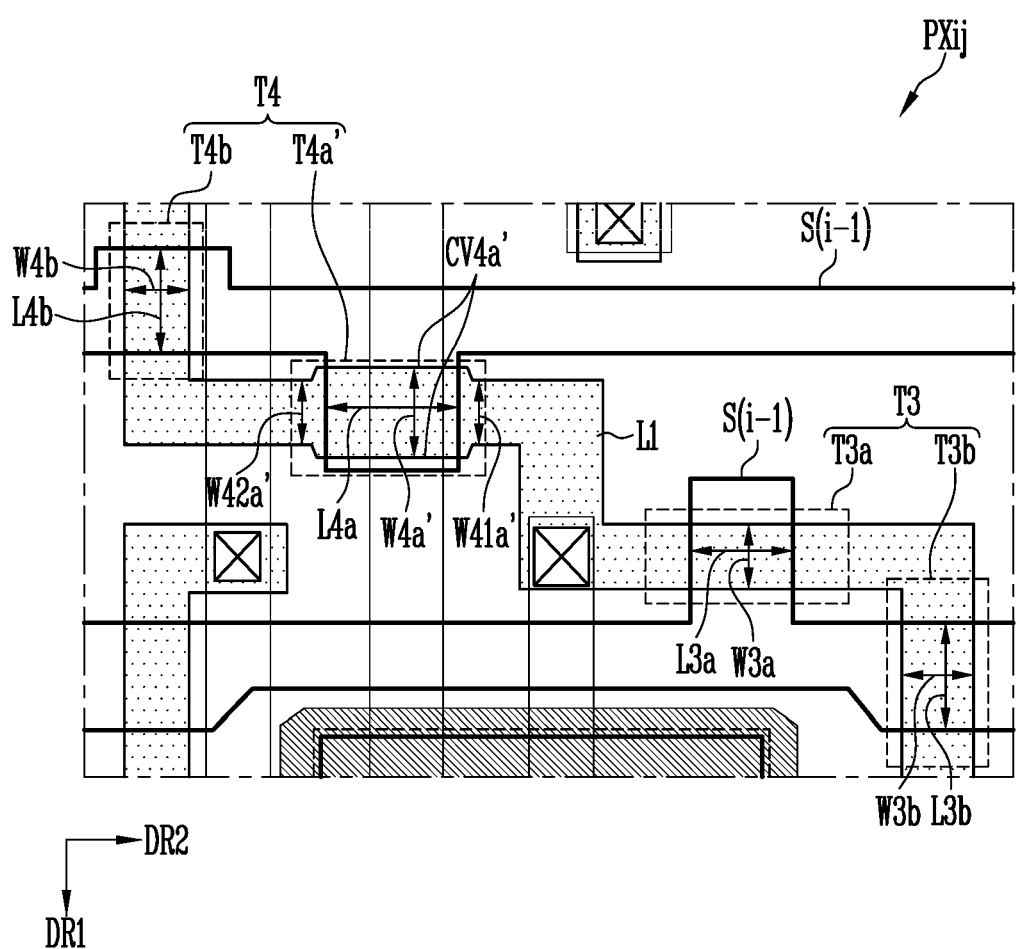
FIG. 10 is a view illustrating a case where a channel of a (4-1)th sub-transistor includes a convex part.

FIG. 10 is a view illustrating a case where a channel of a (4-1)th sub-transistor includes a convex part.

For example, a channel width W4a' of the (4-1)th sub-transistor T4a' may be wider than the channel width W3a of the (3-1)th sub-transistor T3a.

In an embodiment, the channel width W4a' of the (4-1)th sub-transistor T4a' may be wider than a first electrode region width W41a' and/or a second electrode region width W42a' of the (4-1)th sub-transistor T4a'. For example, the channel of the (4-1)th sub-transistor T4a' may have a convex portion CV4a'.

In another embodiment, the channel width W4a' of the (4-1)th sub-transistor T4a' may be equal to the first electrode region width W41a' and/or the second electrode region width W42a' of the (4-1)th sub-transistor T4a'. For example, the channel of the (4-1)th sub-transistor does not have the convex portion, and the channel width of the (4-1)th sub-transistor T4a' may be wider than the channel width W3a of the (3-1)th sub-transistor T3a. However, in this embodiment, the capacitance of the parasitic capacitor Cp4 may be changed due to an increase in line width of the fifth node N5, and therefore, it may be necessary to reconfirm the leakage current direction of the pixel PXij.

In an embodiment, the channel length L4a of the (4-1)th sub-transistor T4a' may be equal to or shorter than the channel length L3a of the (3-1)th sub-transistor T3a.

In accordance with the embodiments shown in FIG. 10, the leakage current LC4a of the (4-1)th sub-transistor T4a' can be increased.

Figure 11:
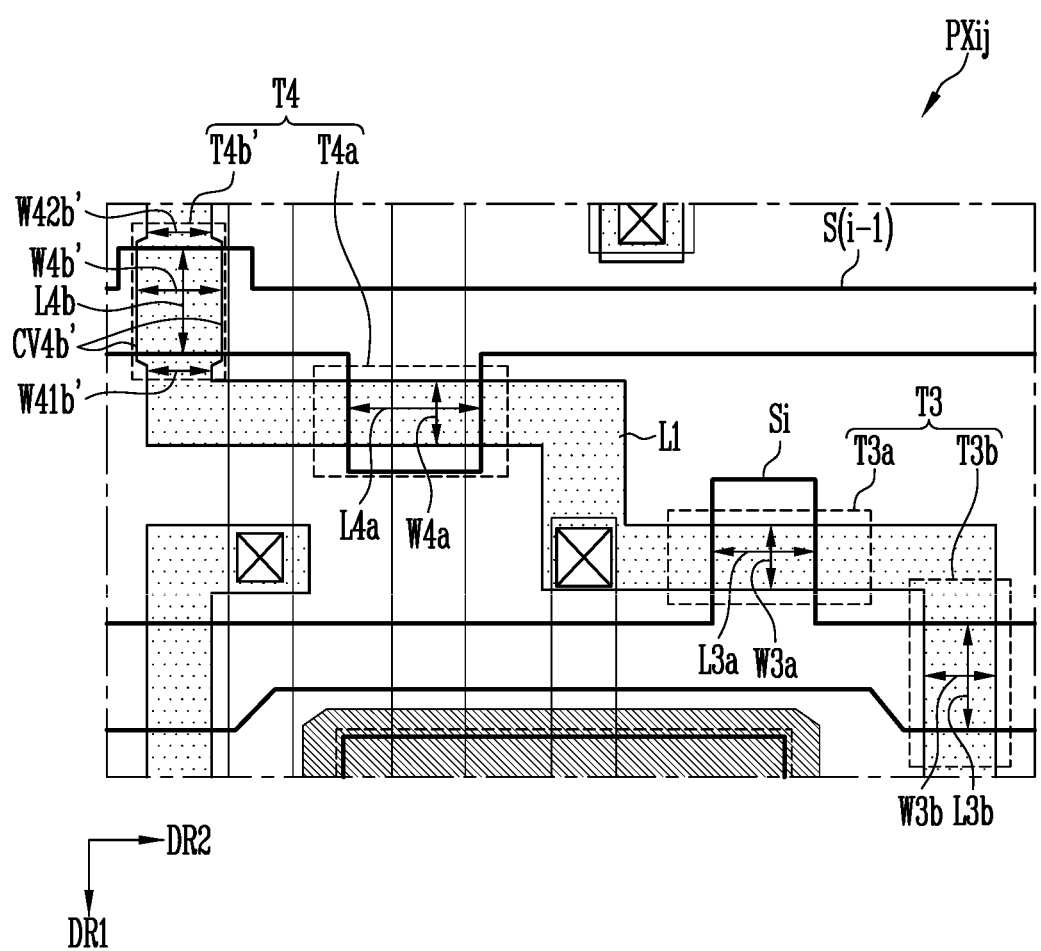
FIG. 11 is a view illustrating a case where a channel of a (4-2)th sub-transistor includes a convex part.

FIG. 11 is a view illustrating a case where a channel of a (4-2)th sub-transistor includes a convex part.

For example, a channel width W4b' of the (4-2)th sub-transistor T4b' may be wider than a channel width W3a of the (3-1)th sub-transistor T3a.

In an embodiment, the width W4b' of the (4-2)th sub-transistor T4b' may be wider than a first electrode region width W41b' and/or a second electrode region width W42b' of the (4-2)th sub-transistor T4b'. For example, the channel of the (4-2)th sub-transistor T4b' may have a convex portion CV4b'.

In another embodiment, the channel width W4b' of the (4-2)th sub-transistor T4b' may be equal to the first electrode region width W41b' and/or the second electrode region width W42b' of the (4-2)th sub-transistor. For example, the channel of the (4-2)th sub-transistor does not have the convex portion, and the channel width W4b' of the (4-2)th sub-transistor T4b' may be wider than the channel width W3a of the (3-1)th sub-transistor T3a. However, in this embodiment, the capacitance of the parasitic capacitor Cp4 may be changed due to an increase in line width of the fifth node N5, and therefore, it may be necessary to reconfirm the leakage current direction of the pixel PXij.

In an embodiment, the channel length L4b of the (4-2)th sub-transistor may be equal to or shorter than that L3a of the (3-1)th sub-transistor T3a.

In accordance with the embodiments shown in FIG. 11, the leakage current LC4b of the (4-2)th sub-transistor T4b' can be increased.

The above-described embodiments shown in FIGS. 8-11 may be selectively combined with each other.

Figure 12:
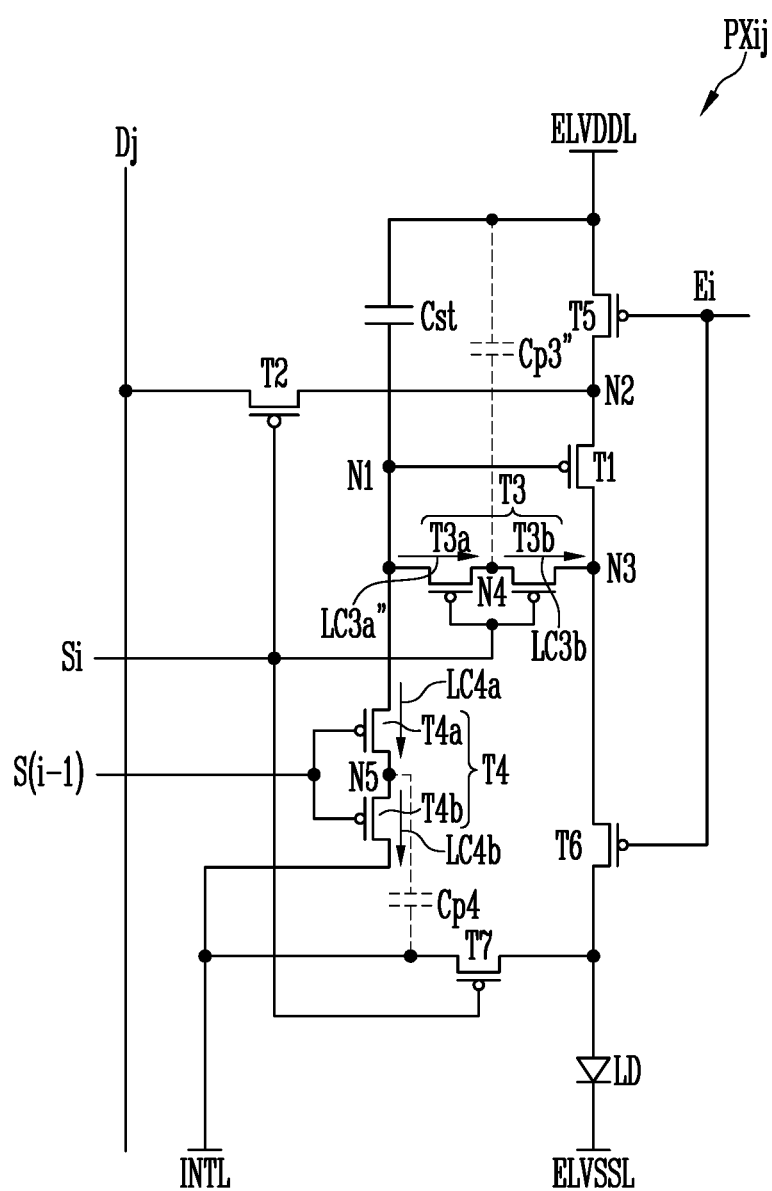
FIG. 12 is a diagram illustrating a pixel of which a leakage current direction different from that shown in FIG. 6 is set.

FIG. 12 is a diagram illustrating a pixel of which a leakage current direction different from that shown in FIG. 6 is set.

There is assumed a case where a leakage current LC3a" of the (3-1)th sub-transistor T3a flows in a direction from the first node N1 to the fourth node N4 due to the difference between a capacitance of a parasitic capacitor Cp3" of the pixel PXij shown in FIG. 12 and the capacitance of the parasitic capacitor Cp3 of the pixel PXij shown in FIG. 6.

Thus, the leakage current LC3a" is increased in the pixel PXij shown in FIG. 12, so that the end luminance EL can be increased.

Figure 13:
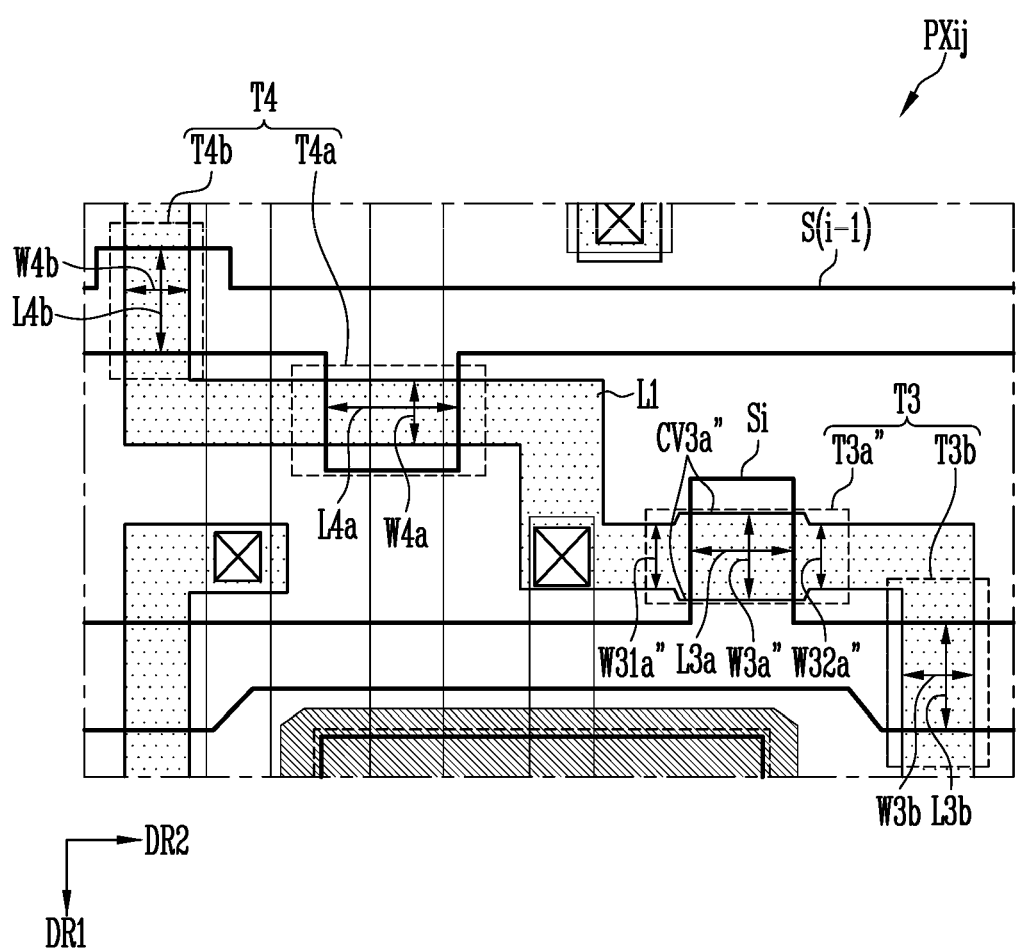
FIG. 13 is a view illustrating a case where the channel of a (3-1)th sub-transistor includes a convex part.

FIG. 13 is a view illustrating a case where the channel of a (3-1)th sub-transistor includes a convex part.

For example, a channel width W3a" of the (3-1)th sub-transistor T3a" may be wider than the channel widths W3b, W4a, and W4b.

In an embodiment, the channel width W3a" of the (3-1)th sub-transistor T3a" may be wider than a first electrode region width W31a" and/or a second electrode region width W32a" of the (3-1)th sub-transistor T3a". For example, the channel of the (3-1)th sub-transistor T3a" may have a convex portion CV3a".

In another embodiment, the channel width W3a" of the (3-1)th sub-transistor T3a" may be equal to the first electrode region width W31a" and/or the second electrode region width W32a" of the (3-1)th sub-transistor T3a". For example, the channel of the (3-1)th sub-transistor T3a" does not have the convex portion, and the channel width W3a" of the (3-1)th sub-transistor T3a" may be wider than the channel widths W3b, W4a, and W4b. However, in this embodiment, the capacitance of the parasitic capacitor Cp3" may be changed due to an increase in line width of the fourth node N4, and therefore, it may be necessary to reconfirm the leakage current direction of the pixel PXij.

In accordance with the embodiments shown in FIG. 13, the leakage current LC3a" of the (3-1)th sub-transistor T3a" can be increased.

Figure 14:
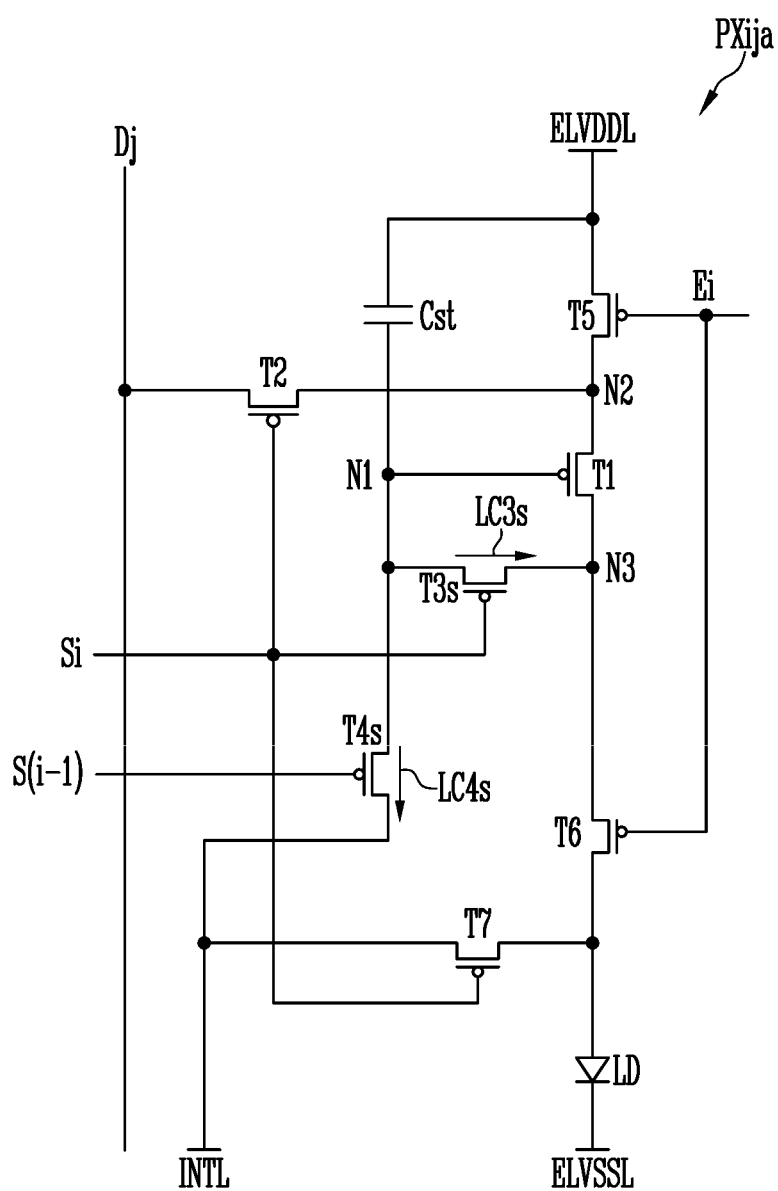
FIGS. 14-16 are diagrams illustrating that embodiments of the present disclosure can be applied to other pixels.
Figure 15:
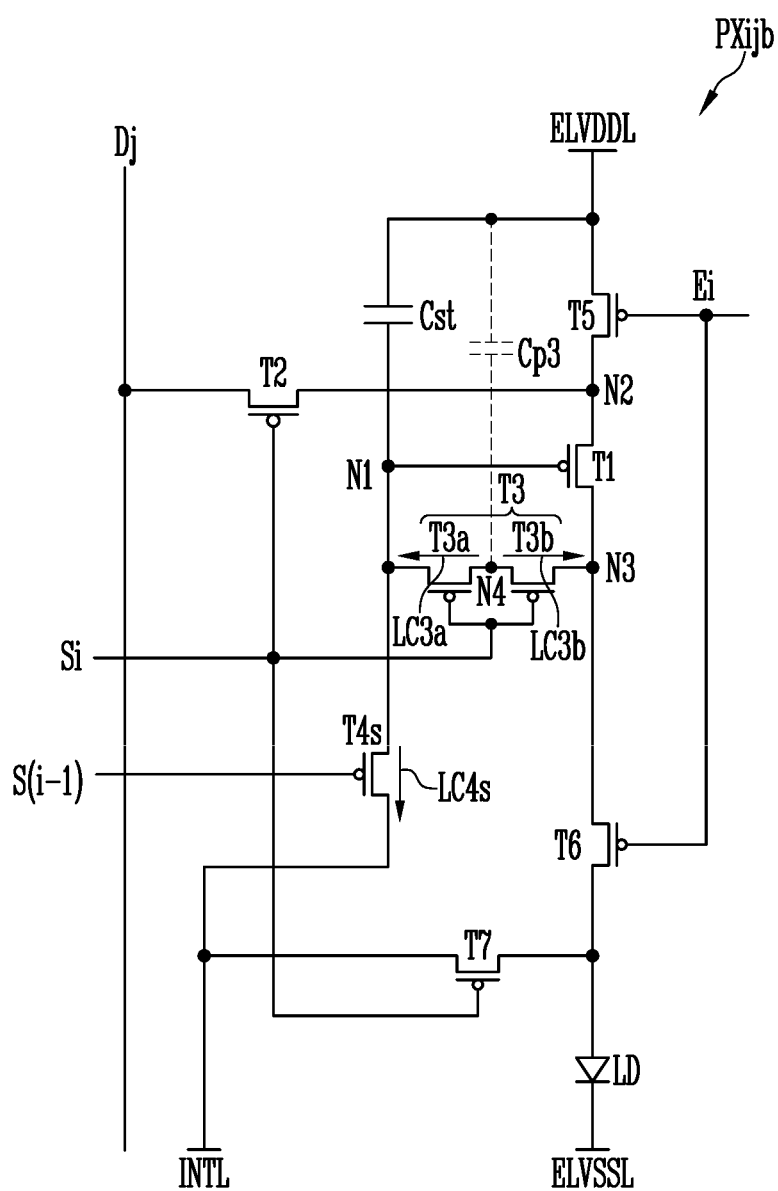

FIGS. 14-16 are diagrams illustrating that embodiments of the present disclosure can be applied to other pixels.

A pixel PXija shown in FIG. 14 is a case where the third transistor T3 shown in FIG. 6 is configured as a single third transistor T3s and the fourth transistor shown in FIG. 6 is configured as a single fourth transistor T4s.

A leakage current LC3s of the third transistor T3s may be generated in a direction from the first node N1 to the third node N3. In addition, a leakage current LC4s of the fourth transistor T4s may be generated in a direction from the first node N1 to the initialization line INTL.

Therefore, the leakage currents LC3s and LC4s may be increased (e.g., preferably increased). In order to increase the leakage currents LC3s and LC4s, refer to the above-described embodiments that include examples of changing channel widths/channel lengths of the third transistor T3s and the fourth transistor T4s.

A pixel PXijb shown in FIG. 15 is a case where the fourth transistor T4 shown in FIG. 6 is configured as a single fourth transistor T4s.

A leakage current LC4s of the fourth transistor T4s may be generated in a direction from the first node N1 to the initialization line INTL.

Therefore, the leakage current LC4s may be increased (e.g., preferably increased). In order to increase the leakage current LC4s, refer to the above-described embodiments that include examples of changing a channel width/channel length of the fourth transistor T4s.

For example, the channel width of the fourth transistor T4s may be wider than that of the (3-1)th sub-transistor T3a. In addition, the channel length of the fourth transistor T4s may be shorter than that of the (3-1)th sub-transistor T3a.

A pixel PXijc shown in FIG. 16 is a case where the third transistor T3 shown in FIG. 6 is configured as a single third transistor T3s.

A leakage current LC3s of the third transistor T3s may be generated in a direction from the first node N1 to the third node N3.

Therefore, the leakage current LC3s may be increased (e.g., preferably increased). In order to increase the leakage current LC3s, refer to the above-described embodiments that include examples of changing a channel width/channel length of the third transistor T3s.

In an embodiment, the channel width of the (4-1)th sub-transistor T4a may be wider than that of the (4-2)th sub-transistor T4b. For example, the channel of the (4-1)th sub-transistor T4a may include a convex portion. In addition, the channel length of the (4-1)th sub-transistor T4a may be shorter than that of the (4-2)th sub-transistor T4b. Accordingly, the leakage current LC4a can be increased.

In an embodiment, the channel width of the (4-2)th sub-transistor T4b may be wider than that of the (4-1)th sub-transistor T4a. For example, the channel of the (4-2)th sub-transistor T4b may include a convex portion. In addition, the channel length of the (4-2)th sub-transistor T4b may be shorter than that of the (4-1)th sub-transistor T4a. Accordingly, the leakage current LC4b can be increased.

In accordance with the present disclosure, the display device can decrease a leakage current in a direction in which luminance decreases, and increase a leakage current in a direction in which luminance increases.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims and their equivalents.

What is claimed is:

1. A display device comprising:
   pixels,
   wherein each of the pixels comprises:
   a first transistor comprising a gate electrode of the first transistor connected to a first node, a first electrode of the first transistor connected to a second node, and a second electrode of the first transistor connected to a third node;
   a second transistor comprising a gate electrode of the second transistor connected to a first scan line, a first electrode of the second transistor connected to a data line, and a second electrode of the second transistor connected to the second node;
   a first sub-transistor comprising a gate electrode of the first sub-transistor connected to the first scan line, a first electrode of the first sub-transistor connected to the first node, and a second electrode of the first sub-transistor connected to a fourth node; and a second sub-transistor comprising a gate electrode of the second sub-transistor connected to the first scan line, a first electrode of the second sub-transistor connected to the fourth node, and a second electrode of the second sub-transistor connected to the third node, and wherein a channel width of the second sub-transistor is wider than a channel width of the first sub-transistor.

2. The display device of claim 1, wherein the channel width of the first sub-transistor is narrower than a first electrode region width or a second electrode region width of the first sub-transistor.

3. The display device of claim 2, wherein a channel of the first sub-transistor comprises a concave portion.

4. The display device of claim 1, wherein the channel width of the second sub-transistor is wider than a first electrode region width or a second electrode region width of the second sub-transistor.

5. The display device of claim 4, wherein a channel of the second sub-transistor comprises a convex portion.

6. The display device of claim 1, wherein a channel length of the second sub-transistor is equal to or shorter than a channel length of the first sub-transistor.

7. The display device of claim 1, wherein each of the pixels further comprises:

a third sub-transistor comprising a gate electrode of the third sub-transistor connected to a second scan line, a first electrode of the third sub-transistor connected to the first node, and a second electrode of the third sub-transistor connected to a fifth node; and a fourth sub-transistor comprising a gate electrode of the fourth sub-transistor connected to the second scan line, a first electrode of the fourth sub-transistor connected to the fifth node, and a second electrode of the fourth sub-transistor connected to an initialization line, and wherein a channel width of a third sub-transistor is wider than the channel width of the first sub-transistor.

8. The display device of claim 7, wherein the channel width of the third sub-transistor is wider than at least one of a first electrode region width and a second electrode region width of the third sub-transistor.

9. The display device of claim 8, wherein a channel of the third sub-transistor comprises a convex portion.

10. The display device of claim 1, wherein each of the pixels further comprises:

a third sub-transistor comprising a gate electrode of the third sub-transistor connected to a second scan line, a first electrode of the third sub-transistor connected to the first node, and a second electrode of the third sub-transistor connected to a fifth node; and a fourth sub-transistor comprising a gate electrode of the fourth sub-transistor connected to the second scan line, a first electrode of the fourth sub-transistor connected to the fifth node, and a second electrode of the fourth sub-transistor connected to an initialization line, and wherein a channel width of the fourth sub-transistor is wider than the channel width of the first sub-transistor.

11. The display device of claim 10, wherein the channel width of the fourth sub-transistor is wider than a first electrode region width or a second electrode region width of the fourth sub-transistor.

12. The display device of claim 11, wherein a channel of the fourth sub-transistor comprises a convex portion.

13. The display device of claim 1, wherein each of the pixels further comprises a fourth transistor comprising a gate electrode of the fourth transistor connected to a second scan line, a first electrode of the fourth transistor connected to the first node, and a second electrode of the fourth transistor connected to an initialization line, and wherein a channel width of the fourth transistor is wider than the channel width of the first sub-transistor.

14. A display device comprising:

pixels, wherein each of the pixels comprises:

a first transistor comprising a gate electrode of the first transistor connected to a first node, a first electrode of the first transistor connected to a second node, and a second electrode of the first transistor connected to a third node;

a second transistor comprising a gate electrode of the second transistor connected to a first scan line, a first electrode of the second transistor connected to a data line, and a second electrode of the second transistor connected to the second node;

a first sub-transistor comprising a gate electrode of the first sub-transistor connected to the first scan line, a first electrode of the first sub-transistor connected to the first node, and a second electrode of the first sub-transistor connected to a fourth node; and a second sub-transistor comprising a gate electrode of the second sub-transistor connected to the first scan line, a first electrode of the second sub-transistor connected to the fourth node, and a second electrode of the second sub-transistor connected to the third node, and wherein a channel width of the first sub-transistor is wider than a channel width of the second sub-transistor.

15. The display device of claim 14, wherein the channel width of the first sub-transistor is wider than a first electrode region width or a second electrode region width of the first sub-transistor.

16. The display device of claim 15, wherein a channel of the first sub-transistor comprises a convex portion.

* * * * *